US010923686B2

(12) United States Patent
Wan et al.

(10) Patent No.: US 10,923,686 B2
(45) Date of Patent: Feb. 16, 2021

(54) HEAT DISSIPATING STRUCTURE OF A FLEXIBLE DISPLAY

(71) Applicant: Wuhan China Star Optoelectronics Semiconductor Display Technology Co., Ltd., Wuhan (CN)

(72) Inventors: Ying Wan, Wuhan (CN); Sheng Liu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/492,955

(22) PCT Filed: Jan. 17, 2019

(86) PCT No.: PCT/CN2019/072167
§ 371 (c)(1),
(2) Date: Sep. 11, 2019

(87) PCT Pub. No.: WO2020/118853
PCT Pub. Date: Jun. 18, 2020

(65) Prior Publication Data
US 2020/0203655 A1     Jun. 25, 2020

(30) Foreign Application Priority Data

Dec. 15, 2018  (CN) .......................... 201811537756.4

(51) Int. Cl.
*H01L 27/32*     (2006.01)
*H01L 51/52*     (2006.01)
*H05K 7/20*      (2006.01)

(52) U.S. Cl.
CPC ........ *H01L 51/529* (2013.01); *H01L 27/3246* (2013.01); *H01L 51/5212* (2013.01);
(Continued)

(58) Field of Classification Search
CPC ....... H01L 2251/301; H01L 2251/5338; H01L 27/3246; H01L 51/5212; H01L 51/5221; H01L 51/529
(Continued)

(56) References Cited

U.S. PATENT DOCUMENTS

2010/0035148 A1* 2/2010 Wakita .................. H01M 4/621
429/209
2015/0123095 A1   5/2015 Washio
(Continued)

FOREIGN PATENT DOCUMENTS

CN     105789247      7/2016
CN     205488133      8/2016
(Continued)

*Primary Examiner* — Long K Tran

(57) ABSTRACT

A heat dissipation structure for a flexible display is disclosed, and includes: a substrate, an anode metal layer, light emitting diode elements, a pixel defining layer, a cathode metal layer, and a heat conducting insulator disposed in sequence. The pixel defining layer has grooves, and the heat conducting insulator is sandwiched between the anode metal layer and the cathode metal layer, and disposed in the grooves. The heat conducting insulator is used to connect the anode metal layer and the cathode metal layer, so as to form an electrically insulating and thermally conducting path between the anode metal layer and the cathode metal layer.

17 Claims, 2 Drawing Sheets

(52) U.S. Cl.
CPC ..... *H01L 51/5221* (2013.01); *H05K 7/20972* (2013.01); *H01L 2251/301* (2013.01); *H01L 2251/5338* (2013.01)

(58) Field of Classification Search
USPC .......................................................... 257/40
See application file for complete search history.

(56) References Cited

U.S. PATENT DOCUMENTS

| | | | |
|---|---|---|---|
| 2016/0049615 A1 | 2/2016 | Kim et al. | |
| 2017/0287984 A1* | 10/2017 | Koresawa | H01L 27/322 |
| 2018/0367117 A1* | 12/2018 | Goto | H03H 9/6489 |
| 2019/0073505 A1* | 3/2019 | Kwon | G06K 9/0004 |

FOREIGN PATENT DOCUMENTS

| | | |
|---|---|---|
| CN | 108878668 | 11/2018 |
| JP | 2002-056986 | 2/2002 |
| JP | 2004-192813 | 7/2004 |

\* cited by examiner

HEAT DISSIPATING STRUCTURE OF A FLEXIBLE DISPLAY

RELATED APPLICATIONS

This application is a National Phase of PCT Patent Application No. PCT/CN2019/072167 having International filing date of Jan. 17, 2018, which claims the benefit of priority of Chinese Patent Application No. 201811537756.4 filed on Dec. 15, 2018. The contents of the above applications are all incorporated by reference as if fully set forth herein in their entirety.

FIELD AND OF BACKGROUND OF THE INVENTION

The present invention relates to a field of a heat dissipating structure for a display, and more particularly, to a field of the heat dissipating structure of a flexible display by using a heat conducting insulator to connect between an anode metal layer and a cathode metal layer.

Currently, active-matrix organic light-emitting diodes (AMOLEDs) have low driving voltage, low power consumption, fast response times, light weight, self-luminescence, wide viewing angles, high color saturation and high contrast, thinness and flexibility. It is generally considered to be a next generation mainstream display. However, because organic light-emitting diode (OLED) panels have shorter service life, applications of OLED panels are limited. An important factor affecting the service life of an OLED panel is heat. If the heat dissipation capability is insufficient, the service life of the device will be shortened. Heat sources of the OLED panel are mainly concentrated in two parts: heat generated from an exciton junction of OLED components and heat generated from a thin film transistor (TFT) circuit. The problem that heat generated by the OLED component is mainly solved by endothermic and highly reliable materials. They will greatly enhance the service life of the OLED panel that effectively transfer the heat generated by the thin film transistor circuit.

At present, a heat dissipating structure is disclosed for an AMOLED that a graphite heat dissipating layer is provided on a back plate of a display to enhance heat dissipating. As shown in FIG. 1, which shows a heat dissipating structure of an existing AMOLED including: a back plate 103 and a flexible substrate 104. The flexible substrate 104 is provided with a thin film transistor layer 105 and an organic light emitting layer 106. In order to enhance the heat dissipation of the display, a graphite heat dissipating layer 102 and a copper layer 101 are disposed on a bottom surface of the back plate 103.

However, the heat dissipating structure of the display still has the following problems in actual use. For example, it still has the flexible substrate and the back plate interposed between the graphite heat dissipating layer and the thin film transistor devices, result that the heat transfer is obstructed. In addition, the graphite heat dissipating layer is formed by extruding, and then glued and coated, there are many defective products during the manufacturing process. Likewise, during a singulation process, an edge of the graphite heat dissipating layer is prone to collapse, which may cause particle contamination in the subsequent process, so a graphite heat sink layer needs to be bound edge, which leads to higher cost of the graphite heat sink layer.

Therefore, it is necessary to provide a heat dissipating structure of a flexible display to solve the problems existing in the conventional art.

TECHNICAL PROBLEM: the present invention provides a heat dissipating structure of a flexible display, to solve the problem that a flexible substrate and a back plate interposed between the graphite heat dissipating layer and the thin film transistor devices, result that the heat transfer is obstructed.

SUMMARY OF THE INVENTION

The main purpose of the present invention is to provide a heat dissipating structure of a flexible display, which can make heat generated from exciton junction of OLED components and from the thin film transistor circuit dissipating through a heat conducting insulator, sandwiched between an anode metal layer and a cathode metal layer, to form a thermal conducting path between the anode metal layer and the cathode metal layer, thereby transferring the heat generated from the exciton junction of the OLED light-emitting component and from the thin film transistor circuit to the external environment.

A secondary object of the present invention is to provide a heat dissipating structure of a flexible display without using a graphite heat dissipating layer, thereby producing a thinner panel to meet thickness requirement of flexible display.

A third object of the present invention is to provide a heat dissipating structure of a flexible display, which can reduce the panel manufacturing cost without using a costly graphite heat dissipating layer, thereby expanding the application range of the flexible display.

In order to achieve the foregoing object of the present invention, an embodiment of the present invention provides a heat dissipating structure of a flexible display, including: a substrate provided with an active layer thereon, wherein the active layer is connected to a source electrode and a drain electrode; an anode metal layer electrically connected to the drain electrode; a plurality of light emitting diode elements disposed on the anode metal layer and electrically connected to the anode metal layer; a pixel defining layer disposed on the anode metal layer and covering the light emitting diode elements, wherein the pixel defining layer has a plurality of grooves; a cathode metal layer disposed on the pixel defining layer and electrically connected to the light emitting diode elements; and a heat conducting insulator sandwiched between the anode metal layer and the cathode metal layer and disposed in the grooves, wherein the heat conducting insulator separately contacts with the anode metal layer and the cathode metal layer, to form a thermally conducting path between the anode metal layer and the cathode metal layer.

Moreover, another embodiment of the present invention provides A heat dissipating structure of a flexible display, including: a substrate provided with an active layer thereon the substrate, wherein the active layer is connected to a source electrode and a drain electrode; an anode metal layer electrically connected to the drain electrode; a plurality of light emitting diode elements disposed on the anode metal layer and electrically connected to the anode metal layer; a pixel defining layer disposed on the anode metal layer and covering the light emitting diode elements, wherein the pixel defining layer has a plurality of grooves; a cathode metal layer disposed on the pixel defining layer and electrically connected to the light emitting diode elements; and a heat conducting insulator sandwiched between the anode metal layer and the cathode metal layer and disposed in the grooves, to form a thermally conducting path between the anode metal layer and the cathode metal layer.

Furthermore, yet another embodiment of the present invention provides a heat dissipating structure of a flexible display, including: a substrate provided with an active layer thereon the substrate, wherein the active layer is connected to a source electrode and a drain electrode; a first metal layer electrically connected to one of the source electrode and the drain electrode; a plurality of light emitting diode elements disposed on the first metal layer and electrically connected to the first metal layer; a pixel defining layer disposed on the first metal layer and covering the light emitting diode elements; a second metal layer disposed on the pixel defining layer and electrically connected to the light emitting diode elements; and a vertically heat conducting insulator sandwiched between the first metal layer and the second metal layer, to form a thermally conducting path between the first metal layer and the second metal layer.

In an embodiment of the invention, the grooves penetrate through the pixel defining layer, and the heat conducting insulator is separately in contact with the anode metal layer and the cathode metal layer, so that heat is directly transferred from the anode metal layer to the cathode metal layer via the heat conducting insulator.

In an embodiment of the invention, a heat dissipating material layer is disposed on the cathode metal layer to commonly form a thermally conducting path with the heat conducting insulator, the anode metal layer and the cathode metal layer.

In an embodiment of the invention, the heat conducting insulator is made of an electrically insulating and heat conducting material, such that the anode metal layer and the cathode metal layer are in contact with and insulated from the heat conducting insulator; and the heat dissipating material layer is an electrically insulating transparent heat dissipating material, which is in contact with and electrically insulated from the cathode metal layer.

In an embodiment of the invention, the heat conducting insulator has a plurality of nano-ceramic particles.

In an embodiment of the invention, the heat dissipating material layer is an aluminum nitride film.

In an embodiment of the invention, the heat conducting insulator has a coefficient of thermal conductivity ranging from 50 to 150 w/m•° C. and a relative dielectric constant ranging from 5 to 60; and the heat dissipating material layer has a coefficient of thermal conductivity ranging from 100 to 200 w/m•° C. and a relative dielectric constant ranging from 5 to 60.

In an embodiment of the invention, a light shielding barrier is sandwiched between the anode metal layer and the cathode metal layer and disposed between the light emitting diode elements; and the heat conducting insulator is spaced apart from the light shielding barrier, and only disposed in a non-pixel display region.

In an embodiment of the invention, the heat conducting insulator further comprises a light absorbing pigment, and the heat conducting insulator is further disposed between the light emitting diode elements to be configured as a light shielding barrier.

BENEFICIAL EFFECT: Compared with the conventional art, the heat dissipating structure of the flexible display according to the present invention not only simplifies the manufacturing process of the heat dissipating structure of the flexible display, but also solves the existing problem in conventional art that a flexible substrate and a back plate interposed between the graphite heat dissipating layer and the thin film transistor devices, result that the heat transfer is obstructed. It is also possible to make a thinner panel without using a graphite heat dissipating layer to meet the thickness requirement of the flexible display.

In view of the above, the present invention provides a heat dissipating structure of a flexible display to solve the existing problem in conventional art that a flexible substrate and a back plate interposed between the graphite heat dissipating layer and the thin film transistor devices, result that the heat transfer is obstructed, so that the heat transfer is obstructed.

BRIEF DESCRIPTION OF THE SEVERAL VIEWS OF THE DRAWINGS

In order to make the above description of the present invention more comprehensible, the preferred embodiments are described below, and in conjunction with the accompanying drawings, the detailed description is as follows.

DESCRIPTION OF SPECIFIC EMBODIMENTS OF THE INVENTION

Figure 1:
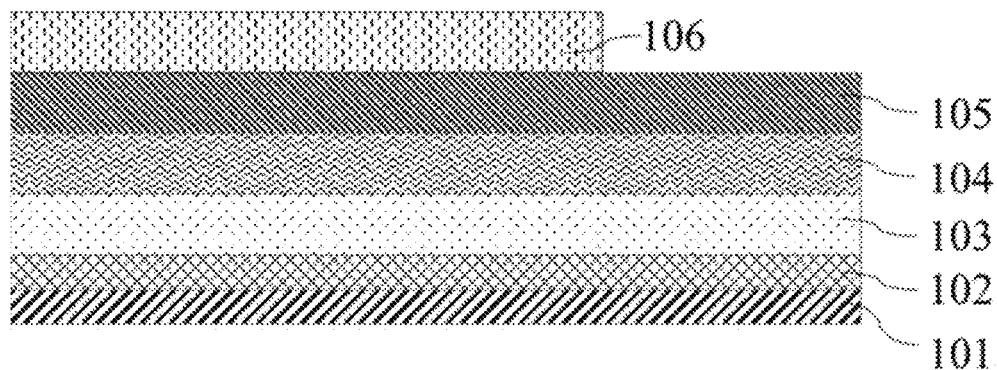
FIG. 1 is a schematic view of a conventional heat dissipating structure of a flexible display.

Those skilled in the relevant art will understand that for simplicity and clarity, elements shown in the figures are not necessarily to scale. That is, in various embodiments, the selected elements are illustrated to enhance the understanding of the functions and the configurations. In commercially implemented case, generally easy to understand and may be useful or necessary components may not describe or illustrate in the schematic diagrams of the following embodiments. It should also be appreciated that certain actions and/or steps in the embodiments of the method described or depicted are not necessarily required to occur in a particular order, and such specific sequences are not necessarily required by those skilled in the art. It should also be understood that the vocabulary and terms used in the specification have a general meaning, unless there are other specific meanings described in this document, otherwise these vocabulary and terms are the meaning of investigation and research in their respective fields.

In order to make the objects, technical solutions and advantages of the embodiments of the present invention more clear, the technical solutions of the embodiments of the present invention will be clearly and completely described in conjunction with the accompanying drawings of the embodiments of the present invention. It is apparent that the described embodiments are part of the embodiments of the invention, and not all of the embodiments. All other embodiments obtained by those of ordinary skill in the art based on the described embodiments of the invention are within the scope of the invention.

The following description of the various embodiments is described in conjunction with the accompanying drawings, to illustrate the specific embodiments of the invention.

Unless otherwise defined, technical terms or scientific terms used herein shall be the general meaning as understood by those of skill in the art. The words "first", "second" and similar terms used in the specification and claims of the present invention do not denote any order, quantity, or importance, but are merely used to distinguish different components. Similarly, the words "a", "an", "the" and "said" and similar terms does not denote a quantity limitation, but rather indicates that there is at least one, including plural references, unless the context clearly dictates otherwise. For example, the term "a heat conducting insulator" or "at least one heat conducting insulator" may include a plurality of heat conducting insulators, including compositions thereof. The words "connected to" or "connected with" and the like are not limited to physical or mechanical connections, but may include electrical connections, whether direct or indirect. Furthermore, the directional terms mentioned in the present invention, such as upper, lower, top, bottom, front, rear, left, right, inner, outer, side, surrounding, central, horizontal, lateral, vertical, longitudinal, axial, radial, uppermost or lowermost, etc., only refer to the direction of the accompanying drawing. Therefore, the directional terms used in the description is for the purpose of illustration and understanding of the invention, instead of limiting the invention.

Figure 2:
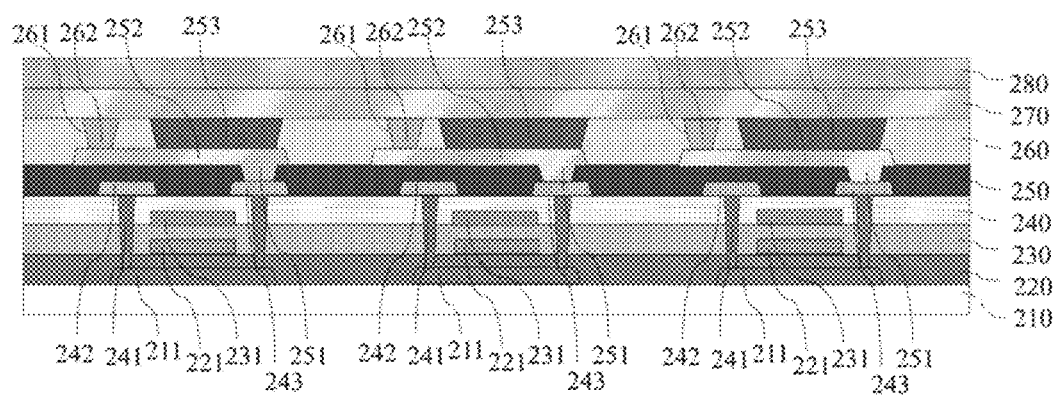
FIG. 2 is a schematic view of a heat dissipating structure of a flexible display according to a first embodiment of the present invention.

As shown in FIG. 2, a heat dissipating structure of a flexible display according to a first embodiment of the present invention mainly includes a substrate 210, an active layer 211 disposed on the substrate 210, and the active layer 211 connected to a source electrode 242 and a drain electrode 243. An anode metal layer 252 is electrically connected to the drain electrode 243. A plurality of light emitting diode element 253 is disposed on the anode metal layer 252 and electrically connected to the anode metal layer 252. A pixel defining layer 260 is disposed on the anode metal layer 252 and the light emitting diode element 253, the pixel defining layer 260 has a plurality of grooves 261. A cathode metal layer 270 disposed on the pixel defining layer 260 and electrically connected to the light emitting diode element 253. A heat conducting insulator 262 sandwiched between the anode metal layer 252 and the cathode metal layer 270 and disposed in the grooves 261 to form a thermally conducting path between the anode metal layer 252 and the cathode metal layer 270.

The present invention will be described in detail below with reference to FIG. 2 for a detailed description of detailed construction, an assembly relationship, and an operation principle of the above-described respective elements of the first embodiment.

The substrate 210 may be a glass substrate or a flexible substrate, and material of the flexible substrate may be, but not limited to, polyimide (PI), polyethylene terephthalate (PET), polyether ether ketone (PEEK), polyethersulfone (PES), and the like. The active layer 211 is disposed on the substrate 210. A buffer layer may be disposed between the substrate 210 and the active layer 211. The buffer layer may be made of silicon oxide, silicon nitride, or a combination thereof. The active layer 211 may be an amorphous silicon layer applied a crystallization heat treatment, and the crystallization heat treatment may be a rapid thermal annealing (RTA) process, an excimer laser annealing (ELA) process or a furnace annealing process. After that, the amorphous silicon layer is modified to form a polysilicon layer. Then, the polysilicon layer is applied a channel doping process and a heavily doping process to form a channel doped region and a heavily doped layer, and then apply a patterning process by etching a portion of the polysilicon layer to form the active layer 211. A first gate insulating layer 220 and a first gate 221 are disposed on the active layer 211. A second gate insulating layer 230 is disposed on the first gate insulating layer 220 and the first gate 221, and a second gate 231 is disposed on the second gate insulating layer 230. An intermediary layer 240 covers the second gate 231. The first gate insulating layer 220, the second gate insulating layer 230, and the intermediary layer 240 have a plurality of vias 241 extending through and electrically connected to the active layer 211. The active layer 211 is electrically connected to the source electrode 242 and the drain electrode 243 through the vias 241. A planar layer is disposed on the source electrode 242 and the drain electrode 243, and covers the source electrode 242 and the drain electrode 243, and is provided with a via 251. The anode metal layer 252 is electrically connected to the drain electrode 243 through the via 251. A plurality of light emitting diode elements 253 are disposed on the anode metal layer 252 and electrically connected to the anode metal layer 252. The pixel defining layer 260 is disposed on the anode metal layer 252 and covers the light emitting diode elements 253. The pixel defining layer 260 has the plurality of grooves 261, and the heat conducting insulator 262 is disposed in the grooves 261. The cathode metal layer 270 is disposed on the pixel defining layer 260 and electrically connected to the light emitting diode elements 253. The heat conducting insulator 262 is sandwiched between the anode metal layer 252 and the cathode metal layer 270 to form the thermally conducting path between the anode metal layer 252 and the cathode metal layer 270.

In an embodiment of the invention, the grooves 261 penetrate through the pixel defining layer 260, and the heat conducting insulator 262 is separately in contact with the anode metal layer 252 and the cathode metal layer 270, so that heat is directly transferred from the anode metal layer 252 to the cathode metal layer 270 via the heat conducting insulator 262.

In an embodiment of the present invention, a heat dissipating material layer 280 is disposed on the cathode metal layer 270 to commonly form a thermally conducting path with the heat conducting insulator 262, the anode metal layer 252, and the cathode metal layer 270.

In an embodiment of the present invention, the heat conducting insulator 262 is made of an electrically insulating and heat conducting material, such that the anode metal layer 252 and the cathode metal layer 270 are in contact with and insulated from the heat conducting insulator 262; and the heat dissipating material layer 280 is an electrically insulating transparent heat dissipating material, which is in contact with and electrically insulated from the cathode metal layer 270.

In an embodiment of the invention, the heat conducting insulator 262 has a plurality of nano-ceramic particles.

In an embodiment of the invention, the heat dissipating material layer 280 is an aluminum nitride film.

In an embodiment of the invention, the heat conducting insulator 262 has a coefficient of thermal conductivity ranging from 50 to 150 w/m•° C. and a relative dielectric constant ranging from 5 to 60; and the heat dissipating material layer 280 has a coefficient of thermal conductivity ranging from 100 to 200 w/m•° C. and a relative dielectric constant ranging from 5 to 60.

Figure 2A:
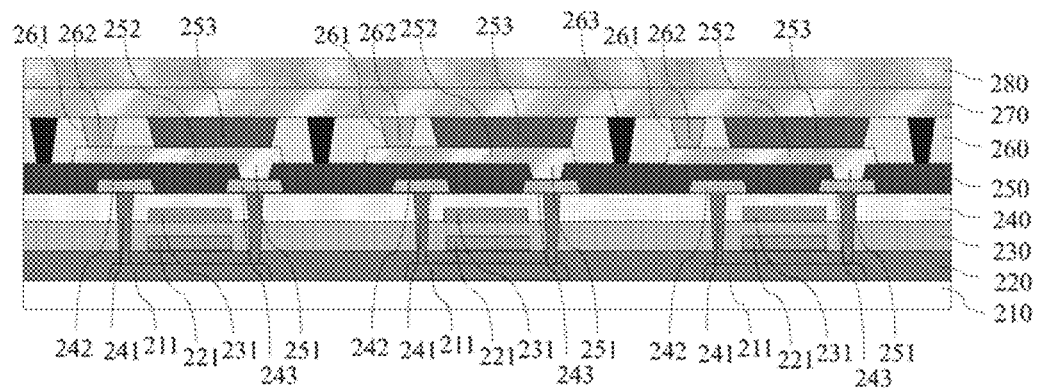

Referring to FIG. 2A, a light shielding barrier (263) is sandwiched between the anode metal layer 252 and the cathode metal layer 270 and disposed between the light emitting diode elements 253, and the light shielding barrier 263 may be a black matrix; the heat conducting insulator 262 is spaced apart from the light shielding barrier 263, and the heat conducting insulator 262 is only disposed in a non-pixel display region. In the present embodiment, the heat conducting insulator 262 is formed by grooving the pixel defining layer 260 and injecting an electrically insulating and heat conducting material into the grooves. The light shielding barrier 263 is formed by grooving the pixel defining layer 260 and injecting a light shielding material into the grooves.

In an embodiment of the invention, the heat conducting insulator 262 further includes a light absorbing pigment, and the heat conducting insulator 262 is further disposed between the light emitting diode elements 253 to be configured as a light shielding barrier. The heat conducting insulator 262 is formed by grooving the non-pixel display region of the pixel defining layer 260 and injecting an electrically insulating, light absorbing, and heat conducting material.

Figure 3:
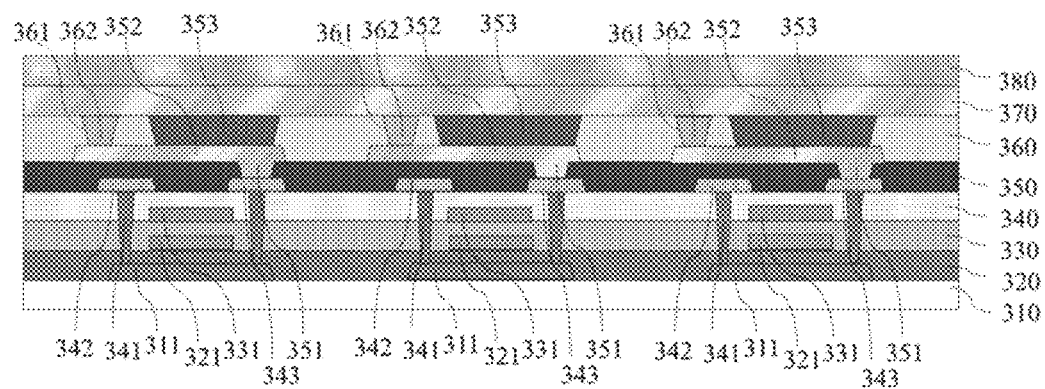

Furthermore, FIG. 3 shows another embodiment of the present invention provides another heat dissipating structure of a flexible display, including: a substrate 310 provided with an active layer 311 on the substrate 310, wherein the active layer 311 is connected to a source electrode 342 and a drain electrode 343; a first metal layer 352 electrically connected to one of the source electrode 342 and the drain electrode 343; a plurality of light emitting diode elements 353 disposed on the first metal layer 352 and electrically connected to the first metal layer 352; a pixel defining layer 360 disposed on the first metal layer 352 and covering the light emitting diode elements 353; a second metal layer 370 disposed on the pixel defining layer 360 and electrically connected to the light emitting diode elements 353; and a vertically heat conducting insulator 362 sandwiched between the first metal layer 352 and the second metal layer 370 to form a thermally conducting path between the first metal layer 352 and the second metal layer 370. Optionally, the first metal layer is one of the anode layer or the cathode layer, and the second metal layer is the other of the cathode layer or the anode layer.

As described above, compared with the existing heat dissipating structure of the flexible display, although the existing heat dissipating structure can use a graphite heat dissipating layer on a back plate of the display, but because there are a flexible substrate and the back plate interposed between the graphite heat dissipating layer and thin film transistor devices, result that the heat transfer is obstructed. The heat dissipating structure of the flexible display according to the present invention shown in FIG. 2 is provided with the heat conducting insulator between the anode metal layer and the cathode metal layer. It can effectively transfer heat generated by the exciton junction of the OLED components and a thin film transistor circuit to external environment, thereby improving the service life of the OLED panel.

It is understood that the specific features of the present invention are described by separate embodiments for clarity, and may be provided in a combination of a single embodiment. Conversely, in the present invention, for the sake of brevity, various features described in the context of a single embodiment can also be implemented separately, or in any suitable sub-combination, or in any other described embodiment suitable for use in the present invention. The specific features described in the context of the various embodiments are not considered to be essential features of those embodiments unless the embodiments do not function without those elements.

Although the present invention has been described in conjunction with specific embodiments thereof, it will be appreciated that many alternatives, modifications, and variations will be apparent to those skilled in the art. Accordingly, it is intended to cover all alternatives, modifications and variations falling within the scope of the appended claims.

All publications, patents and patent applications mentioned in this specification are hereby incorporated by reference herein. The extent is as specifically and individually indicated as individual publications, patents or patent applications, which are incorporated herein by reference. Further, the cited or indicated any reference is not to be construed as an admission that such reference is available as prior art to the present invention. The headings in this application are used herein to make the description easy to understand and should not be construed as limiting.

What is claimed is:

1. A heat dissipating structure of a flexible display, comprising:
a substrate provided with an active layer thereon, wherein the active layer is connected to a source electrode and a drain electrode;
an anode metal layer electrically connected to the drain electrode;
a plurality of light emitting diode elements disposed on the anode metal layer and electrically connected to the anode metal layer;
a pixel defining layer disposed on the anode metal layer and covering the light emitting diode elements, wherein the pixel defining layer has a plurality of grooves;
a cathode metal layer disposed on the pixel defining layer and electrically connected to the light emitting diode elements; and
a heat conducting insulator sandwiched between the anode metal layer and the cathode metal layer and disposed in the grooves, wherein the heat conducting insulator separately contacts the anode metal layer and the cathode metal layer to form a thermally conducting path between the anode metal layer and the cathode metal layer,
wherein the heat conducting insulator has a plurality of nano-ceramic particles.

2. The heat dissipating structure of the flexible display according to claim 1, wherein a heat dissipating material layer is disposed on the cathode metal layer to commonly form the thermally conducting path with the heat conducting insulator, the anode metal layer, and the cathode metal layer.

3. The heat dissipating structure of the flexible display according to claim 2, wherein the heat conducting insulator is made of an electrically insulating and heat conducting material, such that the anode metal layer and the cathode metal layer are in contact with and insulated from the heat conducting insulator; and the heat dissipating material layer is an electrically insulating transparent heat dissipating material which is in contact with and electrically insulated from the cathode metal layer.

4. The heat dissipating structure of the flexible display according to claim 3, wherein the heat dissipating material layer is an aluminum nitride film.

5. The heat dissipating structure of the flexible display according to claim 3, wherein the heat conducting insulator has a coefficient of thermal conductivity ranging from 50 to 150 w/m•° C. and a relative dielectric constant ranging from 5 to 60; and the heat dissipating material layer has a coefficient of thermal conductivity ranging from 100 to 200 w/m•° C. and a relative dielectric constant ranging from 5 to 60.

6. The heat dissipating structure of the flexible display according to claim 1, wherein a light shielding barrier is sandwiched between the anode metal layer and the cathode metal layer and disposed between the light emitting diode elements; and the heat conducting insulator is spaced apart from the light shielding barrier, and only disposed in a non-pixel display region.

7. The heat dissipating structure of the flexible display according to claim 4, wherein the heat conducting insulator further comprises a light absorbing pigment, and the heat conducting insulator is further disposed between the light emitting diode elements to be configured as a light shielding barrier.

8. A heat dissipating structure of a flexible display, comprising:
- a substrate provided with an active layer thereon the substrate, wherein the active layer is connected to a source electrode and a drain electrode;
- an anode metal layer electrically connected to the drain electrode;
- a plurality of light emitting diode elements disposed on the anode metal layer and electrically connected to the anode metal layer;
- a pixel defining layer disposed on the anode metal layer and covering the light emitting diode elements, wherein the pixel defining layer has a plurality of grooves;
- a cathode metal layer disposed on the pixel defining layer and electrically connected to the light emitting diode elements; and
- a heat conducting insulator sandwiched between the anode metal layer and the cathode metal layer and disposed in the grooves to form a thermally conducting path between the anode metal layer and the cathode metal layer,
- wherein the heat conducting insulator has a plurality of nano-ceramic particles.

9. The heat dissipating structure of the flexible display according to claim 8, wherein the grooves penetrate through the pixel defining layer, and the heat conducting insulator is separately in contact with the anode metal layer and the cathode metal layer, so that heat is directly transferred from the anode metal layer to the cathode metal layer via the heat conducting insulator.

10. The heat dissipating structure of the flexible display according to claim 9, wherein a heat dissipating material layer is disposed on the cathode metal layer to commonly form a thermally conducting path with the heat conducting insulator, the anode metal layer, and the cathode metal layer.

11. The heat dissipating structure of the flexible display according to claim 10, wherein the heat conducting insulator is made of an electrically insulating and heat conducting material, such that the anode metal layer and the cathode metal layer are in contact with and insulated from the heat conducting insulator; and the heat dissipating material layer is an electrically insulating transparent heat dissipating material, which is in contact with and electrically insulated from the cathode metal layer.

12. The heat dissipating structure of the flexible display according to claim 11, wherein the heat dissipating material layer is an aluminum nitride film.

13. The heat dissipating structure of the flexible display according to claim 11, wherein the heat conducting insulator has a coefficient of thermal conductivity ranging from 50 to 150 w/m·° C. and a relative dielectric constant ranging from 5 to 60; and the heat dissipating material layer has a coefficient of thermal conductivity ranging from 100 to 200 w/m·° C. and a relative dielectric constant ranging from 5 to 60.

14. A heat dissipating structure of a flexible display, comprising:
- a substrate provided with an active layer thereon the substrate, wherein the active layer is connected to a source electrode and a drain electrode;
- a first metal layer electrically connected to one of the source electrode and the drain electrode;
- a plurality of light emitting diode elements disposed on the first metal layer and electrically connected to the first metal layer;
- a pixel defining layer disposed on the first metal layer and covering the light emitting diode elements;
- a second metal layer disposed on the pixel defining layer and electrically connected to the light emitting diode elements; and
- a vertically heat conducting insulator sandwiched between the first metal layer and the second metal layer to form a thermally conducting path between the first metal layer and the second metal layer,
- wherein the heat conducting insulator has a plurality of nano-ceramic particles, and the heat dissipating material layer is an aluminum nitride film.

15. The heat dissipating structure of the flexible display according to claim 14, wherein the first metal layer is an anode metal layer and the second metal layer is a cathode metal layer, and wherein a heat dissipating material layer is disposed on the cathode metal layer to commonly form the thermally conducting path with the heat conducting insulator, the anode metal layer and the cathode metal layer.

16. The heat dissipating structure of the flexible display according to claim 15, wherein the vertically heat conducting insulator is made of an electrically insulating and heat conducting material, such that the anode metal layer and the cathode metal layer are in contact with and insulated from the heat conducting insulator; and the heat dissipating material layer is an electrically insulating transparent heat dissipating material, which is in contact with and electrically insulated from the cathode metal layer.

17. The heat dissipating structure of the flexible display according to claim 16, wherein the heat conducting insulator has a coefficient of thermal conductivity ranging from 50 to 150 w/m·° C. and a relative dielectric constant ranging from 5 to 60; and the heat dissipating material layer has a coefficient of thermal conductivity ranging from 100 to 200 w/m·° C. and a relative dielectric constant ranging from 5 to 60.

* * * * *